United States Patent [19]

Severns et al.

[11] Patent Number: 5,104,276
[45] Date of Patent: Apr. 14, 1992

[54] ROBOTICALLY LOADED EPITAXIAL DEPOSITION APPARATUS

[75] Inventors: David W. Severns, Sunnyvale; Brian Tompson, Campbell; Paul B. Lindstrom, Aptos; David K. Carlson, Santa Clara, all of Calif.

[73] Assignee: Applied Materials, Inc., Santa Clara, Calif.

[21] Appl. No.: 745,818

[22] Filed: Aug. 16, 1991

Related U.S. Application Data

[62] Division of Ser. No. 354,161, May 19, 1989.

[51] Int. Cl.$^5$ .................................................. C23C 16/00
[52] U.S. Cl. ........................................ 414/222; 118/725
[58] Field of Search ..................... 414/222, 217, 416; 198/346.3; 118/725, 730, 500; 269/40, 46, 287; 204/298.15

[56] References Cited

U.S. PATENT DOCUMENTS

| | | | |
|---|---|---|---|
| 3,850,138 | 11/1974 | Patano | 118/730 |
| 3,933,572 | 1/1976 | O'Conner et al. | 65/33 X |
| 4,329,938 | 5/1982 | Marg | 118/730 |
| 4,496,828 | 1/1985 | Kusmiesz et al. | 118/730 |
| 4,757,890 | 7/1988 | Motoda | 414/225 X |
| 4,823,736 | 4/1989 | Post et al. | 118/730 |
| 4,911,597 | 3/1990 | Maydan et al. | 414/744.2 X |
| 4,928,626 | 5/1990 | Carlson et al. | 118/730 X |
| 5,038,711 | 8/1991 | Dan et al. | 118/728 |

FOREIGN PATENT DOCUMENTS 3639991 6/1987 Fed. Rep. of Germany.

*Primary Examiner*—Robert J. Spar
*Assistant Examiner*—William M. Hienz
*Attorney, Agent, or Firm*—Robert Stoddard

[57] ABSTRACT

A susceptor carrying semiconductor wafers for processing is suspended from a compliant attachment at its upper end and is lowered into a reaction chamber for processing. At the completion of processing, the susceptor is withdrawn vertically to permit a robot to unload the processed wafers and load unprocessed wafers. In order to fix the position of the susceptor during the loading operations, a support carriage is moved into position to engage the lower end of the susceptor. Noxious and corrosive chloride vapors are simultaneously withdrawn from the reaction chamber by a vacuum line attached to the support carriage.

4 Claims, 2 Drawing Sheets

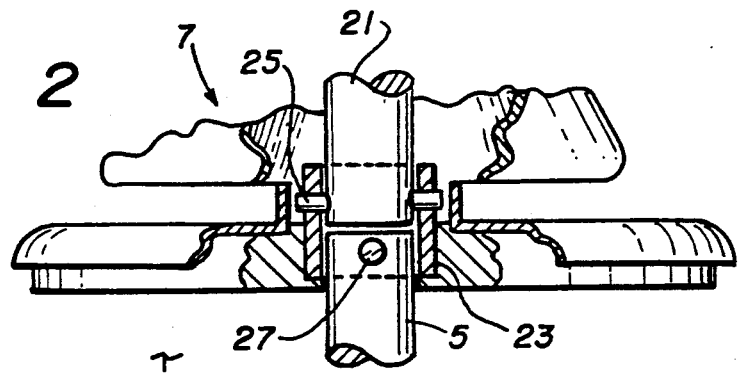
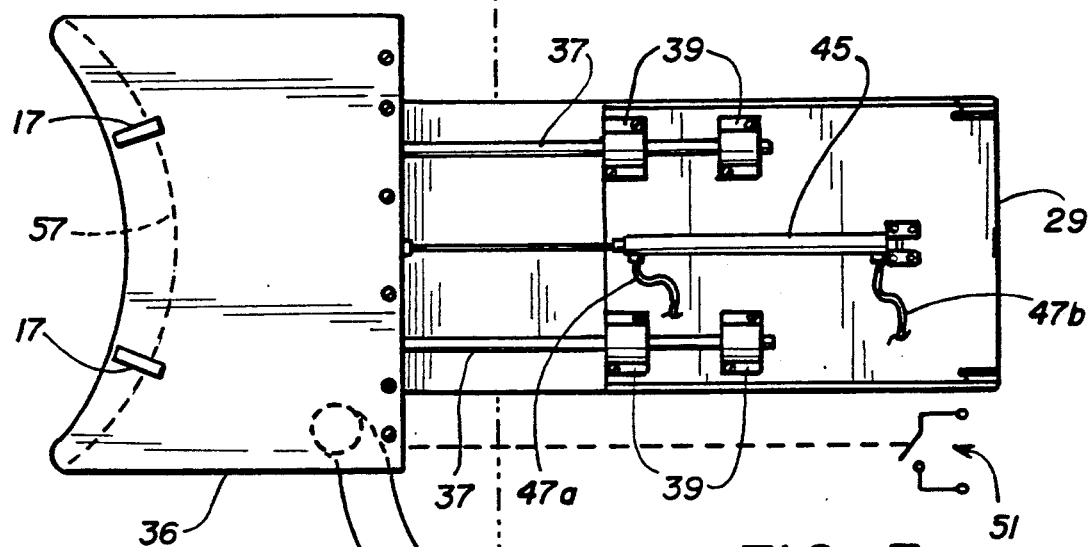
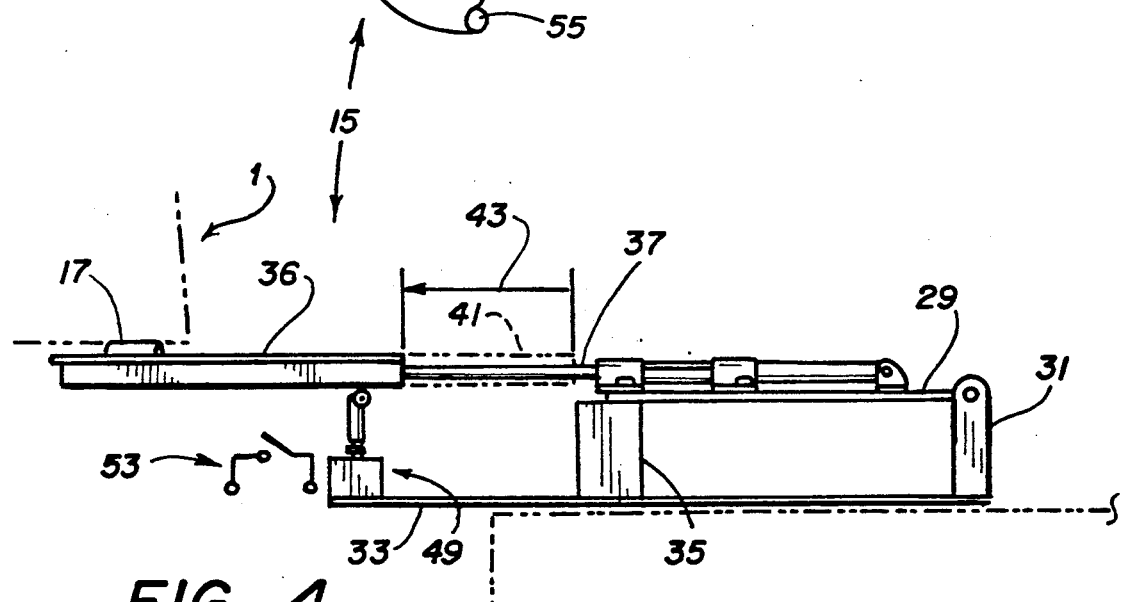

ROBOTICALLY LOADED EPITAXIAL DEPOSITION APPARATUS

This is a division of application Ser. No. 07/354,161 filed May 19, 1989, pending.

BACKGROUND OF THE INVENTION

The present invention relates generally to the field of silicon wafer fabrication equipment useful in the manufacture of semiconductor devices, more particularly to apparatus for depositing an epitaxial layer from a source gas by the chemical vapor deposition (CVD) method, and especially to improvements in such apparatus when used with robotic loading of wafers.

Apparatus of the above type is used in the fabrication of semiconductor devices on 100 millimeter or larger wafers of silicon. Epitaxial layers are formed on the surfaces of the wafers by heating them to temperatures in the region of 1100 to 1200 degrees Celsius in a bell jar containing a gaseous atmosphere consisting of a hydrogen carrier gas mixed with one or more reactive gases such as a silicon source gas or a dopant source gas.

In order to provide automatic processing of a large number of wafers, a robotic loader, together with the necessary control electronics, can be used to automatically load unprocessed wafers onto the susceptor which is used to support them. The susceptor is then loaded into the reaction chamber, processing is carried out, and the susceptor is removed from the reaction chamber, whereupon the robot removes the processed wafers from the susceptor and loads unprocessed wafers.

DESCRIPTION OF THE PRIOR ART

The known prior art is exemplified by automated epitaxial reactor systems of the type represented by the Model 7010 system supplied by Applied Materials of Santa Clara, Calif. This system uses a robotic loader to load and unload substrates from the susceptor.

The geometry and size of this system permit supporting the susceptor quite rigidly from its base. When the susceptor is withdrawn from the bell jar or reaction chamber to permit operation of the robotic substrate loader, a stream of filtered air sweeps over the susceptor surface to remove corrosive vapors such as chlorides which are byproducts of the CVD process.

Although this system performs well, it was desired to develop an automated system in which the susceptor is supported from a single point near its upper end by a suspension mount which provides sufficient compliance to permit the susceptor to center itself below the mount through gravitational force alone. In this regard, it will be understood that the words "compliance" and "compliant", when used in this application with respect to the susceptor mounting of the present invention, denote that flexibility of the mounting which permits the susceptor to swing slightly from side to side in the same manner as if the susceptor were hung from a rope. Such a mounting causes some difficulty during the operation of the robotic loader, since the compliance of the mount permits unwanted movement of the susceptor during loading.

Further, although the filtered air stream of the prior art automated system removed virtually all of the corrosive vapor and particulate contaminants, further improvements in this regard are always considered desirable.

SUMMARY OF THE INVENTION

An object of the present invention is to provide an automated epitaxial reactor system having a greater capacity than the prior art systems.

A further object of the present invention is to provide such a system in which the efficiency of removal of harmful process byproducts is enhanced.

A further object of the present invention is to provide such a system with a self-centering susceptor for supporting substrates.

A further object of the present invention is to provide such a system with a means to support and fix the position of the susceptor during substrate loading operations.

A further object of the present invention is to provide such a system with a means to catch a substrate which is accidentally dropped during the operations of loading or unloading substrates, and to thereby prevent damage to the system.

A further object of the present invention is to provide such a system having a susceptor stabilization means in a form which can be extended toward the susceptor at the start of substrate loading and withdrawn at the end of substrate loading.

A further object of the present invention is to provide such a system in which susceptor stabilization and removal of harmful process byproducts is accomplished by a single movable element.

To the above ends, an automated epitaxial vapor deposition apparatus according to the present invention uses an elongated, multisided susceptor which is suspended by a centrally located gimballed mounting at its top end. The susceptor has sufficient axial length to accommodate two or more substrates on each of its sides.

The susceptor is lowered into a bell jar for processing and raised from the bell jar for loading and unloading of semiconductor substrates. Consequently, the loading of substrates is carried out while the susceptor is suspended directly over the open mouth of the bell jar.

The gimballed upper support of the susceptor has considerable compliance to permit the susceptor to self-center when it is in the bell jar, such that the susceptor can be rotated during processing without significant eccentricity. However, as outlined above, the same compliance comprises a drawback during the operation of loading and unloading substrates by means of a robotic loader. The filtered air stream which is used to aid in the removal of noxious vapors has the additional and unwanted effect of causing the susceptor to swing, making loading of the substrates difficult.

Accordingly, a susceptor stabilization means in the form of a carriage which is movable toward and away from the susceptor carries on its upper surface a pair of compliant contactor pads for frictionally engaging the lower end of the susceptor. When the carriage has been moved to a position near the mouth of the bell jar and beneath the susceptor, the carriage is raised slightly to cause these contactor pads to grip the lower edge of the susceptor, effectively immobilizing it during loading.

The same carriage also incorporates a vacuum duct extending from an opening located on the underside of the carriage, adjacent the mouth of the bell jar, to a remotely located source of low vacuum. Consequently, when the carriage is extended into position below the susceptor, the opening on its underside draws noxious and corrosive vapors and particulate matter from the open mouth of the bell jar.

At the completion of the loading operation, the carriage is withdrawn, permitting the loaded susceptor to be lowered into the bell jar.

BRIEF DESCRIPTION OF THE DRAWING

The above and other features, objects and advantages of the present invention, together with the best mode contemplated by the inventors thereof for carrying out their invention will become more apparent from reading the following description of embodiments of the invention while studying the associated drawing, the various figures of which represent:

FIG. 2 is a detail view, partly broken away, illustrating the gimballed susceptor mounting used in the present invention;

FIG. 3 is a top view illustrating a susceptor stabilization and noxious vapor evacuation apparatus useful in the present invention;

FIG. 4 is a side view of the apparatus of FIG. 3.

DETAILED DESCRIPTION OF THE PRESENT INVENTION

Figure 1:
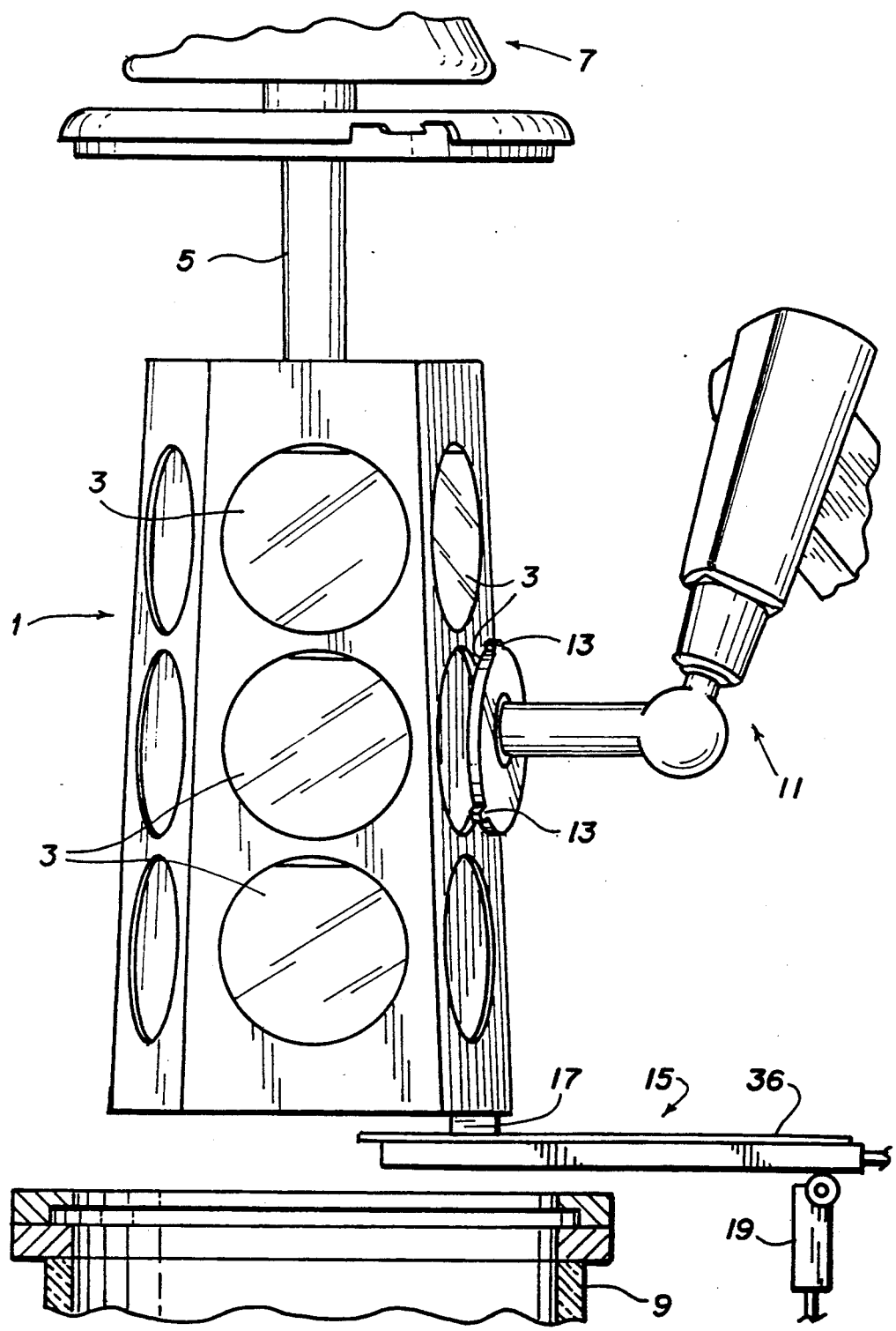
FIG. 1 is a side view, partly in elevation and partly in section, illustrating the present invention during the operations of substrate loading and unloading.

In FIG. 1, a graphite susceptor 1 is shown as it would appear during the operation of loading and unloading semiconductor wafers 3. Susceptor 1 is, for example, an elongated, five-sided support structure having three wafers 3 retained in correspondingly-shaped recesses on each of its sides. As illustrated, susceptor 1 has a slight axial taper, such that it is larger at the bottom than at the top. Formed in this way, each of the sides of susceptor 1 slopes in a sense to provide a small radially inward gravitational force component on each of wafers 3 to prevent accidental dislodging of the wafers during processing.

A support hanger 5, in the form of a short stub shaft, connects susceptor 1 to a rotatable support structure 7 which can be raised to the illustrated loading position and lowered to load susceptor 1 into a reaction chamber or bell jar 9 for processing. During processing within bell jar 9, susceptor 1 and wafers 3 are subjected to temperatures in the region of 1100 to 1200 degrees Celsius in a reactive gaseous environment.

In order to ensure that the mixture of gases in contact with each of the wafers is uniform, susceptor 1 is rotated to agitate and stir the gaseous mixture. Such stirring action is effective at maintaining a uniform gaseous mixture only if susceptor 1 remains centered such that its axis coincides with the axis of rotation. Accordingly, support hanger 5 is supported within support structure 7 in a manner which provides considerable compliance, such that susceptor 1 will self-center by gravitational force as will become clearer from the later discussion of FIG. 2.

Loading of unprocessed substrates and unloading of processed ones is carried out by a robotic loader 11 which is illustrated somewhat schematically in FIG. 1. Loader 11 is equipped with four fingers 13, only two of which are shown in FIG. 1, for gripping each substrate by its edges.

Loader 11 uses a system of infrared sensors (not shown) in order to accurately map the locations of each of the three substrates on each side of susceptor 1. As each of the five sides of susceptor 1 is completed, hanger 5 is rotated to access the next side, whereupon loader 11 begins the operation of loading by storing data which determines the exact location of each of the three substrates on the side.

Using this stored data, loader 11 can efficiently complete the loading of all three substrates without pausing to relocate the appropriate recesses. However, susceptor 1 must remain stationary throughout the loading of each side in order that the location data stored prior to loading remain valid throughout the loading operation.

In accordance with the present invention, susceptor 1 can be maintained in a fixed position throughout the operation of loading each of its sides by the use of a susceptor stabilizer 15 which can be selectively engaged at the start of the loading operation on each side and disengaged when necessary to rotate susceptor 1.

Stabilizer 15 can be simply and effectively realized in a form which engages susceptor 1 at its lower edge, as illustrated in FIG. 1. When thus engaged, susceptor 1 is supported at widely separated points located at its top and bottom, and is firmly fixed during the loading operation.

Although the structure of stabilizer 15 will be fully discussed with respect to FIGS. 3 and 4, it may be noted here that engagement of stabilizer 15 with susceptor 1 is accomplished simply by pressing a pair of frictional contactors 17 (only one of which is visible in FIG. 1) firmly against the lower edge of susceptor 1. For this purpose a lift arm 19, raised and lowered by a pneumatic lift cylinder which will be described later with respect to FIG. 4, is used to raise and lower stabilizer 15 during the loading of susceptor 1.

In FIG. 2, details concerning the mounting of support hanger 5 within support structure 7 are clarified. Support hanger 5 is suspended from a driving shaft 21 by a mounting ring 23 and a pair of trunnion pins 25 and 27. Mounting ring 23 and trunnion pins 25 and 27 together form a gimballed joint which provides sufficient compliance to accommodate a slight misalignment between shafts 5 and 21, and to thus permit susceptor 1 to self-center through the action of gravity.

Rotation of susceptor 1 both during processing and during the substrate loading operation is accomplished by rotating shaft 21, such that the rotary motion is transmitted through the gimballed joint. However, ensuring that each of the sides of susceptor 1 is correctly oriented facing the robotic loader 11 of FIG. 1 requires that the location of these sides be known in relation to the rotational position of shaft 21.

Accordingly, although not shown in FIG. 2, a second pin, azimuthally displaced from pin 25 by an angle which is not 90 degrees, extends through ring 23 and shaft 21 for the purpose of ensuring that susceptor 1 can only be mounted with its sides in a preordained orientation.

FIG. 3 illustrates the structure of stabilizer 15 in top view, while FIG. 4 shows the same structure from the side. A platform 29 is pivotally supported on a pair of upright posts 31 which are joined to a base 33. A stop 35 is also joined to base 33, and serves to limit the downward pivotal motion of platform 29 to the position illustrated, with platform 29 parallel to base 33.

A movable shuttle or carriage 36 is supported upon a pair of traveling rods 37 which are in turn supported within four ball slides 39 mounted on platform 29. Carriage 36 is shown extended to the left in FIGS. 1, 3, and 4 as it would be when in use to stabilize susceptor 1.

However, carriage 36 is movable to the right as indicated by the phantom outline 41 in FIG. 4, such that its full range of motion is as indicated by arrow 43.

A pneumatic cylinder 45 is used to drive carriage 36 either to the left or right in the drawing by applying air pressure to either of a pair of air pressure lines 47a or 47b. Similarly, the entire stabilizer assembly consisting of platform 29, carriage 36, rods 37, slides 39 and cylinder 45 can be raised and lowered by a pneumatic lift cylinder 49 to cause contactor pads 17 to press against the lower edge of susceptor 1.

These horizontal and vertical movements are controlled by automatically actuated air pressure valves (not shown) controlled by a computer (not shown) which also sequences the operation of the robotic loader 11. Data concerning the horizontal position of carriage 36 is provided by a horizontal position switch 51 which is indicated schematically in FIG. 3. Similarly, data concerning the vertical position of the mechanism is provided by a vertical position switch 53 which is indicated schematically in FIG. 4.

Each of switches 51 and 53 is shown coupled to carriage 36 by a dotted line. Whenever carriage 36 is lowered away from susceptor 1, the contacts of switch 53 are closed. Similarly, whenever carriage 36 is withdrawn from the region of susceptor 1 (i.e., moved all the way to the right in the figures), the contacts of switch 51 are closed. Accordingly, by sensing the states of switches 51 and 53, the computer can determine when susceptor 1 can safely be rotated to permit accessing a different side thereof.

In order to extract corrosive vapors from the open mouth of bell jar 9 when carriage 36 is in its illustrated left position, a remotely located vacuum system (not shown) is coupled via a vacuum duct 55 to the underside of carriage 36. Carriage 36 is formed as a hollow member, having a lower wall identical to the upper wall illustrated in FIG. 3 with the exception that the leftmost edge of the lower wall, as indicated by dotted line 57, is undercut to form a downwardly oriented vacuum opening.

Accordingly, carriage 36 serves as a portion of the vacuum duct. During the loading cycle, corrosive vapors and particulate matter within bell jar 9 are drawn into carriage 36, through duct 55, and are collected by the remote vacuum system.

Although this invention has been described with some particularity in reference to embodiments thereof which, taken together, comprise the best mode known to the inventors thereof for carrying out their invention, many changes could be made and many alternative embodiments could thus be derived without departing from the scope of the invention. Consequently, the scope of the invention is to be determined only from the following claims.

We claim:

1. In a semiconductor-processing apparatus of the type employing a reaction chamber for confining a reactive gaseous atmosphere in contact with a substrate, the combination comprising:

a susceptor for supporting said substrate;

susceptor mounting means for supporting said susceptor within said apparatus;

a reaction chamber having a closable opening through which said susceptor can be inserted and removed from said chamber;

chamber loading means for causing relative motion between said chamber and susceptor along a chamber loading axis between a closed position in which said susceptor is confined within said chamber during substrate processing, and an open position in which said susceptor is withdrawn from said chamber through said chamber opening to permit removal of a processed substrate and loading of an unprocessed substrate; and a susceptor stabilization means, independent of the susceptor mounting means, comprising chamber exhaust means for producing a vacuum in a region adjacent said chamber opening for withdrawing noxious process-byproduct vapors from said chamber when said closable opening is open.

2. The apparatus of claim 1 wherein said susceptor mounting means suspends said susceptor within said apparatus at an upper support point on said susceptor, and wherein:

said susceptor stabilization means is mounted on said apparatus and is selectively operable to: (1) move into supporting engagement with said susceptor at a point thereon removed from said upper support point for fixing the position of said susceptor during the loading and removal of substrates, and (2) move out of supporting engagement with said susceptor.

3. The apparatus of claim 1 wherein said susceptor stabilization means comprises:

a carriage selectively movable along a path of motion generally transverse to said chamber loading axis, said path of motion extending from a position adjacent said chamber opening to a position removed from said chamber opening;

a vacuum duct coupled to said carriage for movement therewith along said path of motion, said vacuum duct having an opening adjacent a portion of said carriage facing said chamber loading axis, and extending from said duct opening to a location remote from said chamber axis for connection to a source of vacuum.

4. The apparatus of claim 3 wherein:

said susceptor stabilization means is mounted on said apparatus and is selectively operable to: (1) move into supporting engagement with said susceptor for fixing the position of said susceptor during the loading and removal of substrates, and (2) move out of supporting engagement with said susceptor.

* * * * *